United States Patent
Sulin et al.

(10) Patent No.: US 6,884,497 B2
(45) Date of Patent: Apr. 26, 2005

(54) PVD-COATED CUTTING TOOL INSERT

(75) Inventors: Anette Sulin, Fagersta (SE); Andreas Larsson, Fagersta (SE); Jacob Sjölén, Fagersta (SE)

(73) Assignee: Seco Tools AB, Fagersta (SE)

( * ) Notice: Subject to any disclaimer, the term of this patent is extended or adjusted under 35 U.S.C. 154(b) by 71 days.

(21) Appl. No.: 10/389,737

(22) Filed: Mar. 18, 2003

(65) Prior Publication Data

US 2003/0219633 A1 Nov. 27, 2003

(30) Foreign Application Priority Data

Mar. 20, 2002 (SE) ............................................. 0200871

(51) Int. Cl.$^7$ ................................................. B32B 9/00
(52) U.S. Cl. ......................... 428/216; 51/307; 51/309; 428/336; 428/472; 428/697; 428/698; 428/699
(58) Field of Search ................................. 428/336, 698, 428/699, 697, 472, 216; 51/307, 309

(56) References Cited

U.S. PATENT DOCUMENTS

| | | | |
|---|---|---|---|
| 5,879,823 A | * | 3/1999 | Prizzi et al. ................. 428/699 |
| 6,062,776 A | | 5/2000 | Sandman et al. |
| 6,177,178 B1 | | 1/2001 | Ostlund et al. |
| 6,220,797 B1 | * | 4/2001 | Ishii et al. ................... 428/698 |
| 6,241,431 B1 | * | 6/2001 | Derflinger et al. .......... 407/119 |
| 6,250,855 B1 | | 6/2001 | Persson et al. |
| 6,395,379 B1 | * | 5/2002 | Braendle .................... 428/699 |
| 6,492,011 B1 | * | 12/2002 | Brandle et al. ............. 428/336 |
| 6,565,957 B1 | * | 5/2003 | Nakamura et al. .......... 428/216 |

FOREIGN PATENT DOCUMENTS

| | | |
|---|---|---|
| EP | 1 038 989 A2 | 9/2000 |
| EP | 1 103 635 A2 | 5/2001 |
| JP | 5-320913 | 12/1993 |
| JP | 10-152768 | 6/1998 |
| JP | P2001-234328 A | 8/2001 |
| JP | P2002-126913 A | 5/2002 |
| WO | 01/1639 A1 | 3/2001 |
| WO | 01/16388 A1 | 3/2001 |

OTHER PUBLICATIONS

Partial European Search Report dated Jun. 17, 2003.
Swedish Office Action dated Oct. 11, 2002.
U.S. Appl. No. 10/389,738, filed Mar. 18, 2003, Larsson (copending application).
U.S. Appl. No. 10/392,870, filed Mar. 21, 2003, Ruppi et al. (copending application)

* cited by examiner

Primary Examiner—Archene Turner
(74) Attorney, Agent, or Firm—Burns, Doane, Swecker & Mathis, L.L.P.

(57) ABSTRACT

A coated cemented carbide insert (cutting tool), particularly useful for milling at high cutting speeds in alloyed steels, tool steels and milling in hardened steels includes a WC—Co cemented carbide containing NbC and TaC and a W-alloyed binder phase, and a coating including an inner layer of $Ti_xAl_yN$, $0.8<x+y<1.2$, with $0.25<x/y<1.45$, with columnar grains.

14 Claims, 1 Drawing Sheet

PVD-COATED CUTTING TOOL INSERT

FIELD OF THE INVENTION

The present invention relates to a coated cemented carbide body such as an insert (cutting tool), particularly useful for milling at high cutting speeds in alloyed steels, tool steels and milling in hardened steels.

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

During machining of steels, stainless steels and cast irons with coated cemented carbide tools, the cutting edges are worn according to different wear mechanisms, such as chemical wear, abrasive wear and adhesive wear. At high cutting speeds, the amount of heat generated in the cutting zone is considerable and a plastic deformation of the cutting edge may occur, which in turn yields an enhanced wear by other mechanisms. During milling operations in alloyed steels, adhesive wear is often pronounced and edge chipping occurs frequently as a consequence of delamination or cracking of the protective coating.

The cutting performance with respect to specific wear types can be improved by single actions, however, very often this will have a negative effect on other wear properties. Consequently, successful tool composite materials must be designed as careful optimizations of numerous properties. In the case of milling of alloyed steels and tool steels, which are often in a hardened state, one important balance is between plastic deformation resistance of the cutting edge and edge chipping resistance. A simple measure to increase the resistance to plastic deformation and also the abrasive wear resistance is to lower the binder phase content. However, this will also diminish the toughness of the cutting insert, which can substantially lower the tool life in applications where vibrations or the presence of casting or forging skin put demands on such properties. An alternative way to increase the deformation resistance is to add cubic carbides like TiC, TaC and/or NbC. However, this addition has a negative influence on edge chipping tendencies and so called comb crack formation. The constitution of the applied wear resistant surface coating is a key factor in the properties of the tool. Thicker and more wear resistant coatings are often applied by the chemical vapor deposition (CVD) method. These coatings often also improves the plastic deformation resistance but can to larger extent impair edge toughness. Coatings produced by physical vapor deposition (PVD), which are often thinner, do not provide as good protection against heat and plastic deformation but give very good edge integrity and consequently shows good protection against edge chipping.

To improve all tool properties simultaneously is very difficult and numerous properties of both the protective coating and the cemented carbide substrate and the combination thereof have to be considered. Consequently, commercial coated cemented carbide grades have usually been optimized with respect to one or a few wear types. This also means that they have been optimized for only specific applications.

U.S. Pat. No. 6,062,776 discloses a coated cutting insert particularly useful for milling of low and medium alloyed steels and stainless steels with raw surfaces such as cast skin, forged skin, hot or cold rolled skin or pre-machined surfaces under unstable conditions. The insert is characterized by a WC—Co cemented carbide with a low content of cubic carbides and a rather low W-alloyed binder phase and a coating including an innermost layer of $TiC_xN_yO_z$ with columnar grains, a top layer of TiN and an inner layer of $\kappa\text{-}Al_2O_3$.

U.S. Pat. No. 6,177,178 describes a coated milling insert particularly useful for milling in low and medium alloyed steels with or without raw surface zones during wet or dry conditions. The insert is characterized by a WC—Co cemented carbide with a low content of cubic carbides and a highly W-alloyed binder phase and a coating including an inner layer of $TiC_xN_yO_z$ with columnar grains, an inner layer of $\kappa\text{-}Al_2O_3$ and, preferably, a top layer of TiN.

U.S. Pat. No. 6,250,855 provides a coated cemented carbide cutting tool for wet and dry milling of stainless steels at high cutting speeds. The tool has a cemented carbide body comprising a substrate based on WC—Co without any additions of cubic carbides. The coating includes a very thin layer of TiN, a second layer of (Ti,Al)N with a periodic variation of the Ti/Al ratio and an outermost layer of TiN.

WO 01/16389 discloses a coated milling insert particularly useful for milling in low and medium alloyed steels with or without abrasive surface zones during dry or wet conditions at high cutting speed, and milling hardened steels at high cutting speed. The insert is characterized by WC—Co cemented carbide with a low content of cubic carbides and a highly W-alloyed binder phase and a coating including an innermost layer of $TiC_xN_yO_z$ with columnar grains and a top layer of TiN and an inner layer of $\kappa\text{-}Al_2O_3$.

EP 1103635 provides a cutting tool insert particularly useful for wet and dry milling of low and medium alloyed steels and stainless steels as well as for turning of stainless steels. The cutting tool is comprised of a cobalt cemented carbide substrate with a multi-layer refractory coating thereon. The substrate has a cobalt content of 9.0–10.9 wt % and contains 1.0–2.0 wt % TaC/NbC. The coating consists of an MTCVD $TiC_xN_yO_z$ layer and a multi-layer coating being composed of $\kappa\text{-}Al_2O_3$ and $TiC_xN_yO_z$ layers.

SUMMARY OF THE INVENTION

It has now been found that enhanced cutting performance can be obtained by combining many different features of the cutting tool. Preferably for milling, the cutting insert has excellent performance at high cutting speeds in alloyed steels, tool steels and milling in hardened steels. At these cutting conditions, the cutting tool according to the invention displays improved properties with respect to many of the wear types mentioned earlier.

According to one aspect, the present invention provides a cutting tool insert comprising a cemented carbide body and a coating, the cemented carbide body comprising 7.9–8.6 wt % Co, 0.5–2.1 wt % total amount of cubic carbides of the metals Ta and Nb, the ratio of the weight concentrations of Ta and Nb being 1.0–12.0, and balance WC with a mean intercept length of 0.4–0.9 μm, the binder phase being alloyed with W corresponding to an S-value of 0.81–0.95, and that said coating comprises a layer of $Ti_xAl_yN$ where $0.8 \leq x+y \leq 1.2$, with $0.25 \leq x/y \leq 1.45$, with a thickness of 0.5–7 μm with columnar grains.

According to a further aspect, the present invention provides a method of making a cutting tool insert, comprising a cemented carbide body and a coating, the method comprising: forming a cemented carbide with a composition comprising 7.9–8.6 wt % Co, 0.5–2.1 wt %, total amount of cubic carbides of the metals Ta and Nb, the ratio of the weight concentrations of Ta to Nb being 1.0–12.0, and balance WC, with a mean intercept length in the range 0.4–0.9 μm, the binder phase being alloyed with W corresponding to an S-value within the range 0.81–0.95, and applying a coating to the body comprising a layer of $Ti_xAl_yN$ with $0.25 \leq x/y \leq 1.45$, with a thickness of 0.5–7 μm, with columnar grains using PVD-technique.

DETAILED DESCRIPTION OF THE INVENTION

Figure 1:
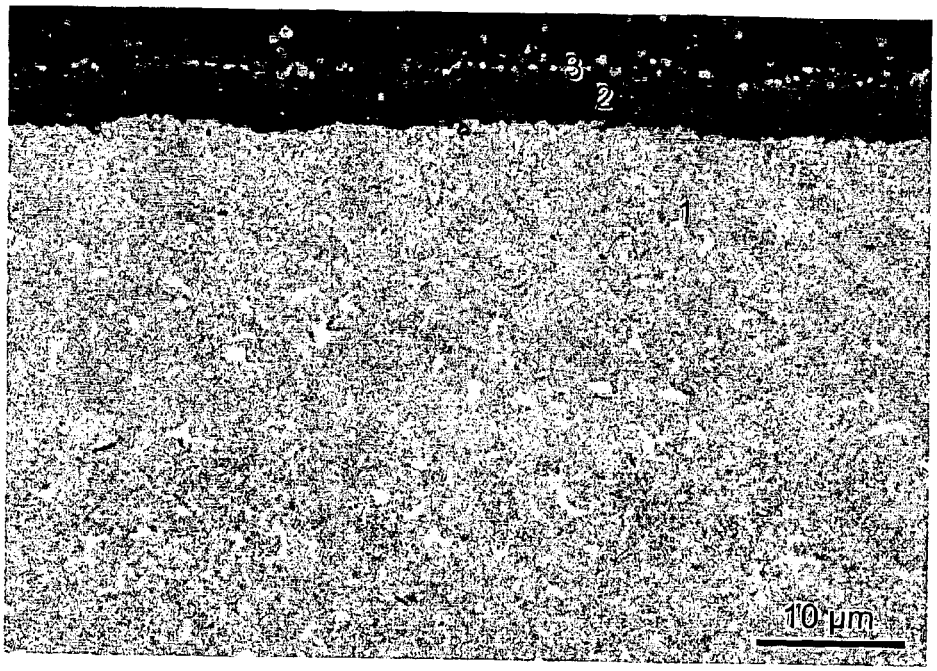
FIG. 1 shows in 2500× magnification of a coated cemented carbide substrate according to the present invention.

The cutting tool insert according to the present invention includes a cemented carbide substrate (1) with a relatively low amount of cubic carbides, with a medium to highly W-alloyed binder phase and a fine to medium WC grain size. This substrate is provided with a wear resisting coating comprising a $Ti_xAl_yN$ layer (2) and an outer TiN layer (3).

According to the present invention, a coated cutting tool insert is provided with a cemented carbide body having a composition of 7.9–8.6 wt % Co, preferably 8.0–8.5 wt % Co, most preferably 8.1–8.4 wt % Co; 0.5–2.1 wt %, preferably 0.7–1.8 wt %, most preferably 0.9–1.5 wt % total amount of cubic carbides of the metals Ti, Nb and Ta and balance WC. Ti, Ta, and/or Nb may also be replaced by other carbides of elements from groups IVB, VB or VIB of the periodic table. The content of Ti is preferably on a level corresponding to a technical impurity. In a preferred embodiment, the ratio between the weight concentrations of Ta and Nb is within 1.0–12.0, preferably 1.5–11.4, most preferably 3.0–10.5.

The cobalt binder phase is medium to highly alloyed with tungsten. The content of W in the binder phase may be expressed as the S-value=$\sigma/16.1$, where $\sigma$ is the measured magnetic moment of the binder phase in $\mu Tm^3kg^{-1}$. The S-value depends on the content of tungsten in the binder phase and increases with a decreasing tungsten content. Thus, for pure cobalt, or a binder in a cemented carbide that is saturated with carbon, S=1 and for a binder phase that contains W in an amount that corresponds to the borderline to formation of η-phase, S=0.78.

It has now been found according to the present invention that improved cutting performance is achieved if the cemented carbide body has an S-value within the range 0.81–0.95, preferably 0.82–0.94, most preferably 0.85–0.92.

Furthermore, the mean intercept length of the tungsten carbide phase measured on a ground and polished representative cross section is in the range 0.4–0.9 μm, preferably 0.5–0.8 μm. The intercept length is measured by means of image analysis on micrographs with a magnification of 10000× and calculated as the average mean value of approximately 1000 intercept lengths.

The coating according to a preferred embodiment includes:
at least one layer of $Ti_xAl_yN$, 0.8<x+y<1.2, with $0.25 \leq x/y \leq 1.45$, preferably $0.33 \leq x/y \leq 1.1$, most preferably $0.42 \leq x/y \leq 0.79$, with a thickness of 0.5–7 μm, preferably 1–6 μm, most preferably 2–5 μm, with columnar grains.

the outermost $Ti_xAl_yN$ layer can be followed by a layer of TiN with a thickness of 0.1–2 μm, preferably 0.1–1.5 μm, most preferably 0.2–1 μm, but a $Ti_xAl_yN$ layer can also be the outermost layer.

The present invention also relates to a method of making a coated cutting tool with a composition of 7.9–8.6 wt % Co, preferably 8.0–8.5 wt % Co, most preferably 8.1–8.4 wt % Co; 0.5–2.1 wt %, preferably 0.7–1.8 wt %, most preferably 0.9–1.5 wt % total amount of cubic carbides of the metals Ti, Nb and Ta and balance WC. Ti, Ta and/or Nb may also be replaced by other carbides of elements from groups IVB, VB or VIB of the periodic table. The content of Ti is preferably on a level corresponding to a technical impurity. In a preferred embodiment, the ratio between the weight concentrations of Ta and Nb is within 1.0–12.0, preferably 1.5–11.4, most preferably 3.0–10.5.

The desired mean intercept length depends on the grain size of the starting powders and milling and sintering conditions and has to be determined by experiments. The desired S-value depends on the starting powders and sintering conditions and also has to be determined by experiments.

The coating layers are deposited using PVD technique preferably arc evaporation, with alloyed or composite Ti—Al metal targets.

The invention also relates to the use of cutting tool inserts according to above for dry milling at high cutting speeds in alloyed steels, tool steels and dry milling in hardened steels at cutting speeds of 50–350 m/min with mean chip thickness values of 0.03–0.18 mm, depending on cutting speed and insert geometry.

EXAMPLE 1

Grade A: A cemented carbide substrate in accordance with the invention with the composition 8.2 wt % Co, 1.2 wt % TaC, 0.2 wt % NbC and balance WC, with a binder phase alloyed with W corresponding to an S-value of 0.87 was produced by conventional milling of the powders, pressing of green compacts and subsequent sintering at 1430° C. Investigation of the microstructure after sintering showed that the mean intercept length of the tungsten carbide phase was 0.7 μm. The substrate was coated in accordance with the invention in an arc evaporation system. Before coating the inserts were degreased in an ultrasonic cleaning line and in situ sputter cleaned with Ti and Ar ions. During deposition, the inserts were attached to a threefold rotating fixture which was negatively biased. Ti and alloyed Ti—Al metal targets were used and the deposition was made in a $N_2$ containing gas mixture. The temperature was kept at 500° C. during the one hour deposition cycle. Two subsequent layers were deposited during the same coating cycle, a 3.4 μm thick $Ti_xAl_yN$ layer with x/y=0.55, followed by a 0.2 μm thick TiN layer. The thickness of the individual layers was measured on the flank face of the inserts using scanning electron microscopy (SEM) on cross-section specimens. The x/y metal ratio was determined using energy dispersive X-ray spectroscopy (EDS) in the SEM. See FIG. 1.

Grade B: A substrate with composition 10 wt % Co, 0.5 wt % $Cr_3C_2$ and balance WC, a binder phase alloyed with W corresponding to an S-value of 0.84, and a mean intercept length of WC in the sintered body of 0.4 μm was combined with a coating according to Grade A (according to the invention).

| Operation | Face milling |
|---|---|
| Cutter diameter | 100 mm |
| Work piece | Bar, 600 mm × 80 mm |
| Material | SS2244, 250 HB |
| Insert type | RPHT1204 |
| Cutting speed | 300 m/min |
| Feed | 0.25 mm/tooth |
| Depth of cut | 2.5 mm |
| Width of cut | 80 mm |
| Coolant | No |
| Results | Tool life (min) |
| Grade A (grade according to invention) | 16 |
| Grade B (coating according to invention) | 10 |

The tool life of Grade A was limited by flank wear. The tool life of Grade B was limited by plastic deformation followed by destruction of the cutting edge. This test shows that the combination of the substrate and coating according to the invention exhibits longer tool life than the coating in combination with a prior art substrate produced without addition of cubic carbides and with WC that yields a much finer mean intercept length in the sintered body.

EXAMPLE 2

Grade C: A substrate according to grade A (according to the invention). The substrate was CVD coated with four subsequent layers deposited during the same coating cycle. First a 0.3 µm thick $TiC_xN_yO_z$ layer with z<0.1 and approximately x/y=0.1, having equiaxed grains. The second layer was 3.1 µm of columnar $TiC_xN_yO_z$ deposited at 835–850° C. using MTCVD technique, yielding an approximated carbon to nitrogen ratio x/y=1.5 with z<0.1. The third layer was a 1.5 µm thick layer of $Al_2O_3$ deposited at approximately 1000° C. and consisting essentially of the κ-phase. Finally a layer of equiaxed nitrogen rich $TiC_xN_yO_z$ with z<0.1 and y>0.8 was deposited to a thickness of 0.3 µm.

| Operation | Copy milling |
|---|---|
| Cutter diameter | 35 mm |
| Work piece | Bar, 350 mm × 270 mm |
| Material | SS2314, 40 HRC |
| Insert type | RPHT1204 |
| Cutting speed | 200 m/min |
| Feed | 0.2 mm/tooth |
| Number of teeth | 3 |
| Depth of cut | 2 mm |
| Width of cut | 5–32 mm |
| Coolant | No |
| Results | Tool life (min) |
| Grade A (grade according to invention) | 40 |
| Grade C (substrate according to invention) | 25 |

The tool life of both grades was limited by edge chipping. The tool life of Grade C was significantly reduced by adhesive wear leading to pick out of the coating and premature edge chipping. This test shows that the combination of the substrate and coating according to the invention exhibits longer tool life than the substrate in combination with a thicker prior art CVD coating.

EXAMPLE 3

Grade D: A substrate according to grade A (according to the invention). The substrate was coated using PVD technique with two subsequent layers deposited during the same coating cycle: a 3.2 µm thick $Ti_xAl_yN$ layer with x/y=1.63 followed by a 0.2 µm thick TiN layer.

| Operation | Face milling |
|---|---|
| Cutter diameter | 100 mm |
| Work piece | Bar, 75 mm × 600 mm |
| Material | SS2244, 250 HB |
| Insert type | SEKN1203 |
| Cutting speed | 250 m/min |
| Feed | 0.25 mm/tooth |
| Depth of cut | 2.5 mm |
| Width of cut | 75 mm |
| Coolant | No |
| Results | Tool life (min) |
| Grade A (grade according to invention) | 21 |
| Grade D (prior art) | 15 |

The tool life was limited by flank wear. The better tool life of Grade D was the consequence of the more wear resistant coating according to the invention.

EXAMPLE 4

Grade E: A commercial cemented carbide cutting insert with composition 9.4 wt % Co, 7.2 wt % TaC, 0.1 wt % NbC, 3.4 wt % TiC and balance WC. The binder phase was alloyed with W corresponding to an S-value of 0.85, and the mean intercept length of the WC was 0.7 µm. The insert was coated with a 1.5 µm (measured on the flank face) thick $Ti_xAl_yN$ layer with an elemental ratio x/y=1.2.

| Operation | Copy milling |
|---|---|
| Cutter diameter | 35 mm |
| Work piece | Bar, 350 mm × 270 mm |
| Material | SS2242, 38 HRC |
| Insert type | RPHT1204 |
| Cutting speed | 200 m/min |
| Feed | 0.22 mm/tooth |
| Number of teeth | 3 |
| Depth of cut | 2 mm |
| Width of cut | 5–32 mm |
| Coolant | No |
| Results | Tool life (min) |
| Grade A (grade according to invention) | 56 |
| Grade E (prior art) | 41 |

The tool life was limited by flank wear and edge chipping. The shorter tool life of Grade E shows the negative effect of high cubic carbide content on cutting edge strength and edge chipping resistance.

The described embodiments of the present invention are intended to be illustrative rather than restrictive, and are not intended to represent every possible embodiment of the present invention. Various modifications can be made to the disclosed embodiments without departing from the spirit or scope of the invention as set forth in the following claims, both literally and in equivalents recognized in law.

We claim:

1. A cutting tool insert comprising a cemented carbide body and a coating, the cemented carbide body comprising 7.9–8.6 wt % Co, 0.5–2.1 wt % total amount of cubic carbides of the metals Ta and Nb, a ratio of the weight concentrations of Ta and Nb being 1.0–12.0, and balance WC with a mean intercept length of 0.4–0.9 μm, a binder phase being alloyed with W corresponding to an S-value of 0.81–0.95, and said coating comprises a layer of $Ti_xAl_yN$ where 0.8<x+y<1.2, with 0.25<x/y<1.45 and a thickness of 0.5–7 μm with columnar grains.

2. The cutting tool insert according to claim 1, wherein the cemented carbide body comprises 8.0–8.5 wt % Co, 0.7–1.8 wt % cubic carbides of the metals Ta and Nb, the ratio of the weight concentrations of Ta to Nb being 5–11.4, the mean intercept length being 0.5–0.8 μm, an S-value of 0.82–0.94, the $Ti_xAl_yN$ layer with 0.33<x/y <1.1, and the thickness of the coating layer being 1–6μm.

3. The cutting tool insert according to claim 1, wherein the coating consists of one layer of $Ti_xAl_yN$ with 0.8<x+y<1.2 and 0.42<x/y<0.79.

4. The cutting tool according to claim 1, further comprising an outer layer of TiN with a thickness of 0.1–2 μm.

5. The cutting tool according to claim 4, wherein the outer layer has a thickness of 0.1–1.5 μm.

6. The cutting tool insert according to claim 1, wherein the layer of $Ti_xAl_yN$ is an outermost layer.

7. The culling tool insert according to claim 1, wherein the S-value is 0.82 to 0.94.

8. The cutting tool insert according to claim 7, wherein the S-value is 0.85 to 0.92.

9. The cutting tool insert according to claim 1, wherein the mean intercept length is 0.5 to 0.8 μm.

10. The cutting tool insert according to claim 1, wherein said coating comprises a layer of $Ti_xAl_yN$ where 0.42<x/y<0.79.

11. The cutting tool insert according to claim 1, wherein the cemented carbide body comprises 8.1 to 8.4 wt. % Co.

12. The cutting tool insert according to claim 1, wherein the total amount of cubic carbides of metals Ta and Nb is 0.7 to 1.8 wt. %.

13. The cutting tool insert according to claim 12, wherein the total amount of cubic carbides of metals Ta and Nb is 0.9 to 1.5 wt. %.

14. A method of milling with the cutting tool insert of claim 1, the method comprising: dry milling hardened steel at a cutting speed of 50–350 m/mim. at a mean chip thickness of 0.03–0.18 mm.

* * * * *